United States Patent [19]

Imamura et al.

[11] Patent Number: 4,556,816
[45] Date of Patent: Dec. 3, 1985

[54] PHOTOELECTRIC DEVICE

[75] Inventors: Yoshinori Imamura, Hachioji; Saburo Ataka, Tokyo; Yukio Takasaki, Hachioji; Yasuo Tanaka, Kokubunji; Tadaaki Hirai, Koganei; Eiichi Maruyama, Kodaira, all of Japan

[73] Assignee: Hitachi, Ltd., Tokyo, Japan

[21] Appl. No.: 510,910

[22] Filed: Jul. 5, 1983

Related U.S. Application Data

[63] Continuation of Ser. No. 216,495, Dec. 15, 1980, abandoned.

[30] Foreign Application Priority Data

Dec. 14, 1979 [JP] Japan .................. 54-161549

[51] Int. Cl.⁴ .................. H01J 31/00; H01J 31/26
[52] U.S. Cl. .................. 313/366; 313/386
[58] Field of Search .............. 313/365, 366, 386, 524, 313/525

[56] References Cited

U.S. PATENT DOCUMENTS 3,984,722 10/1976 Maruyama et al. .................. 313/386
4,249,106 2/1981 Maruyama et al. .................. 313/365
4,255,686 3/1981 Maruyama et al. .................. 313/366

FOREIGN PATENT DOCUMENTS 498662 7/1973 U.S.S.R. .................. 313/386

Primary Examiner—William L. Sikes
Assistant Examiner—Robert E. Wise
Attorney, Agent, or Firm—Antonelli, Terry & Wands

[57] ABSTRACT

Disclosed is a photoelectric device having at least a signal electrode, and an amorphous photoconductor layer whose principal constituent is silicon and which contains hydrogen as an indispensable constituent element, the amorphous photoconductor layer being disposed in adjacency to the signal electrode, characterized by comprising a thin layer interposed between the signal electrode and the amorphous photoconductor layer, the thin layer being made of an inorganic material whose principal constituent is at least one compound selected from the group consisting of oxides of at least one element selected from the group that consists of Si, Ti, Al, Mg, Ba, Ta, Bi, V, Ni, Th, Fe, La, Be, Sc and Co, nitrides of at least one element selected from the group that consists of Ga, Si, Mg, Te, Hf, Zr, Nb and B, and halides of at least one element selected from the group that consists of Na, Mg, Li, Ba, Ca and K.

8 Claims, 3 Drawing Figures

PHOTOELECTRIC DEVICE

This is a continuation of application Ser. No. 216,495, filed Dec. 15, 1980 and abandoned Aug. 19, 1983.

BACKGROUND OF THE INVENTION

1. Field of the Invention

This invention relates to a photoelectric device which is used in the storage mode, and more concretely to the structure of a photosensitive panel which can be employed for the photoconductive target of an image tube, etc.

2. Description of the Prior Art

As a typical example of a photoelectric device which is used in the storage mode, there is a photoconductive image tube shown in FIG. 1. It is constructed of a light-transmitting substrate 1 usually termed "faceplate", a transparent conductive film 2 serving as a signal electrode, a photoconductor layer 3, an electron gun 4, and an envelope 5. In operation, an optical image formed on the photoconductor layer 3 through the faceplate 1 is photoelectrically converted and is stored as a charge pattern in the surface of the photoconductor layer 3, and the charge pattern is read in time sequence by a scanning electron beam 6.

Ordinarily, a beam landing layer 7 is disposed on the surface of the photoconductor layer 3 for the purposes of preventing the inversion of the polarity of the surface charges, blocking the injection of electrons from the scanning electron beam, and so forth.

An important property required of the photoconductor layer 3 at this time is that the charge pattern does not decay due to diffusion within a time interval in which a specified picture element is scanned by the scanning electron beam 6 (i.e., within a storage time).

Examples of such photoconductive targets are described in:

U.S. Pat. No. 3,346,755
U.S. Pat. No. 3,350,595

The use of amorphous silicon for the photoconductor layer 3 is described in, for example, British Specification No. 1,349,351 (E. M. I. Limited).

SUMMARY OF THE INVENTION

An object of this invention is to provide, in a photoelectric device having a photoelectric portion which employs as a photoelectric material an amorphous material including silicon as its principal constituent and containing hydrogen and in which the amorphous photoelectric material and a signal electrode form a rectifying contact type structure, the structure of a photosensitive panel capable of suppressing dark current satisfactorily even in the state in which an intense electric field is applied across a junction interface.

In order to accomplish the object, in this invention, a thin layer of an inorganic material whose principal constituent is at least one compound selected from the group consisting of oxides, nitrides and halides as mentioned below is interposed between a signal electrode and a photoconductor layer made of an amorphous material including silicon as its principal constituent and containing hydrogen.

(1) Oxides

Oxide of at least one element selected from the group consisting of Si, Ti, Al, Mg, Ba, Ta, Bi, V, Ni, Th, Fe, La, Be, Sc and Co.

Concrete examples are as follows: $SiO_2$, $TiO_2$, $Al_2O_3$, $MgO$, $BaO$, $Ta_2O_5$, $Bi_2O_3$, $V_2O_5$, $NiO$, $ThO_2$, $Fe_2O_3$, $La_2O_3$, $BeO$, $Sc_2O_3$, $Co_2O_3$ and eutectics.

(2) Nitrides

Nitride of at least one element selected from the group consisting of Ga, Si, Mg, Ta, Hf, Zr, Nb and B.

Concrete examples are as follows: $GaN$, $Si_3N_4$, $Si_2N_3$, $MgN_2$, $TaN$, $HfN$, $ZrN$, $NbN$, $BN$ and eutectics.

(3) Halides

Halide of at least one element selected from the group consisting of Na, Mg, Li, Ba, Ca and K.

Concrete examples are as follows: $MgF_2$, $LiF$, $NaF$, $BaF_2$, $CaF_2$, $KF$ and eutectics.

It is also possible to employ a layer of a mixture consisting of the aforecited materials, stacked layers of the aforecited materials, etc.

Among the materials listed above, the following ones are particularly preferable. These exhibit remarkable effects of suppressing dark current.

(1) Oxide of at least one element selected from the group consisting of Si, Ba, Ta, Ti and Al.

(2) Nitride of Si or Ta.

(3) Halide of Li or Mg.

Further, $SiO_2$, $Al_2O_3$, $Ta_2O_5$, $Si_3N_4$, $TaN$, $LiF$, $MgF_2$ and any mixture of these compounds are chemically stable and are especially favorable materials.

DETAILED DESCRIPTION OF THE PREFERRED EMBODIMENTS

Figure 1:
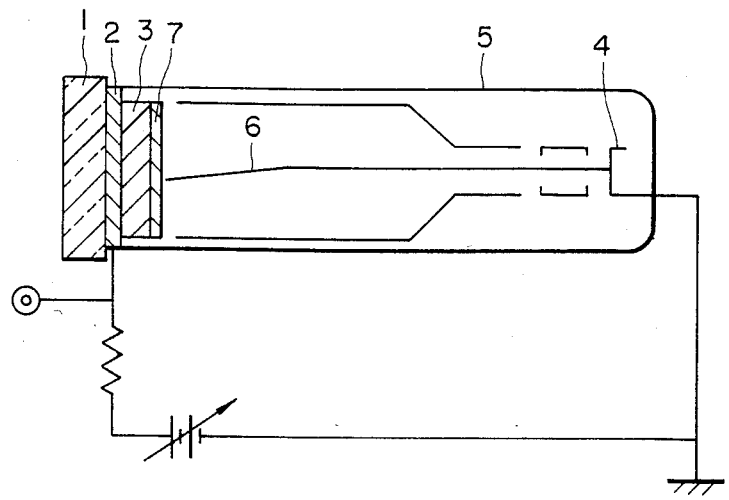
FIG. 1 is a view showing the structure of an image tube.

The use of an amorphous material including silicon as its principal constituent and containing hydrogen for a photoconductor layer as in the invention of the present application has been proposed, and has previously been applied for patent. This corresponds to U.S. patent application Ser. No. 039,580, now U.S. Pat. No. 4,255,686.

The amorphous material whose principal constituent is silicon and which contains hydrogen will be described.

The photoconductor film is formed of a single layer or stacked layers. In general, the single layer of a photoconductive substance or at least one of the stacked layers is made of the amorphous material which contains at least 50 atomic-% of silicon and at least 5 atomic-% to at most 50 atomic-% of hydrogen and whose resistivity is at least $10^{10}$ $\Omega$·cm. Alternatively, a material in which at least 0.1 atomic-% to at most 50 atomic-% of the silicon atoms of the above photoconductor layer is/are substituted with germanium atoms can be employed. Ordinarily, the photoconductor film has its thickness selected from within a range of 100 nm to 20 $\mu$m.

The photoconductive materials concerning this invention are produced by various methods. Hereunder, typical examples will be described.

The first method is the reactive sputtering.

As a target for sputtering, a slice of fused silica may be employed. Of course, single-crystal and polycrystalline silicon may well be employed. In case of the amorphous material containing silicon and germanium, a target in which these two group-IV elements are combined is used. In this case, it is convenient to construct the target by, for example, placing a foil of germanium on a substrate of silicon. By properly selecting the ratio between the areas of silicon and germanium, the composition of the amorphous material can be controlled. Of course, a silicon foil may well be disposed on a germanium substrate contrariwise. Further, both the substances may well be juxtaposed to construct the target, or a melt of the composition may well be used.

When Si containing phosphorus (P), arsenic (As), boron (B) etc. in advance is used as the target for sputtering, these elements can be introduced as impurity elements. With this method, an amorphous material having any desired conductivity type such as n-type and p-type can be obtained. Such doping with the impurity makes it possible to vary the resistance value of the material. Even a high resistivity on the order of $\sim 10^{13}$ $\Omega \cdot$cm can be realized. A method in which diborane or phosphine is mixed into a rare gas can also be employed for such doping with the impurity.

Using the means as stated above, in an Ar atmosphere containing hydrogen ($H_2$) at any of various mixing ratios of at most 90 mol-%, a radio-frequency discharge is generated to sputter Si and deposit it onto the substrate, whereby a thin layer can be formed. In this case, the pressure of the Ar atmosphere containing hydrogen may be any within a range in which the glow discharge can be sustained, and it is usually 0.001–1.0 Torr or so. In case of 0.001–0.1 Torr, the discharge is especially stable. The temperature of the sample substrate is preferably selected between the room temperature and 300° C. 150°–250° C. are the most practical. At a too low temperature, it is difficult to introduce hydrogen into the amorphous material conveniently, and at a too high temperature, hydrogen tends to be emitted from the amorphous material conversely. The hydrogen content of the amorphous material is controlled by controlling the partial pressure of hydrogen in the Ar atmosphere. In case where the quantity of hydrogen in the atmosphere is made 20–80 mol-%, a content of approximately 30 atomic-% can be realized in the amorphous material. Regarding other compositions, the partial pressure of hydrogen may be set with a rough standard at this proportion. The hydrogen components in the materials have been obtained in such a way that hydrogen gas produced by heating was quantified by the mass spectroscopy.

Ar of the atmosphere can be replaced with another rare gas such as Kr.

In obtaining a film of high resistivity, a low-temperature high-speed sputtering equipment of the magnetron type is preferred.

The second method of producing the amorphous materials concerning this invention is a method employing the glow discharge. The amorphous material is formed in such a way that the glow discharge of $SiH_4$ is performed to decompose an organic substance and deposit its constituent onto a substrate. The glow discharge may be caused either by the D.C. bias method or by the radio-frequency discharge method. In order to obtain an amorphous material of particularly good quality, the temperature of the substrate needs to be held at 200° C.–400° C.

An amorphous material of the p-type or the n-type can be produced in such a way that 0.1–1% (volumetric ratio) of $B_2H_6$ or the like or $PH_3$ or the like is further mixed into a mixed gas consisting of $SiH_4$ and $CH_4$, respectively. The amorphous films in this invention can also be formed by the electron-beam evaporation in an atmosphere containing $H_2$.

The inorganic materials to be disposed between the photoconductor layer and the signal electrode are as described before. Principal materials are summed up as Table 1. In the list of the table, the materials have been divided into three classes in accordance with their effects on dark current.

TABLE 1

| Materials | Characteristics Dark current (Target voltage $V_T = 50$ V) (Relative value) | | |
|---|---|---|---|
| | 1 | 1-2 | 2-10 |
| Oxides | $SiO_2$, BaO, $Ta_2O_5$, $TiO_2$, $Al_2O_3$ | MgO, $V_2O_5$, NiO, $Fe_2O_3$, $CoO_3$ | $Bi_2O_3$, $ThO_2$, $La_2O_3$, BeO, $ScO_3$ |
| Nitrides | $Si_3N_4$, TaN | GaN, $Si_2N_3$, $MgN_2$ | HfN, ZrN, NbN, BN |
| Halides | LiF, $MgF_2$ | $BaF_2$, $CaF_2$, NaF, KF | |

As apparent from the table, especially $SiO_2$, BaO, $TiO_2$, $Ta_2O_5$ and $Al_2O_3$ among oxides, $Si_3N_4$ and TaN among nitrides and LiF and $MgF_2$ among halides exhibit extraordinarily excellent characteristics. Exhibitive of the next favorable chacteristics are MgO, $V_2O_5$, NiO, $Fe_2O_3$ and $Co_2O_3$ among oxides, GaN, $Si_2N_3$ and $MgN_2$ among nitrides and $BaF_2$, $CaF_2$, NaF and KF. Exhibitive of still next favorable characteristics are $Bi_2O_3$, $ThO_2$, $La_2O_3$, BeO and $ScO_3$ among oxides, and HfN, ZrN, NbN and BN.

$SiO_2$, $Al_2O_3$, $Ta_2O_5$, $Si_3N_4$, TaN, LiF and $MgF_2$ are chemically stable, and are applied to this invention very favorably. The reason is that the photoconductor to overlie the layer of the inorganic material is the material containing hyrogen. More specifically, during the formation of the photoconductor, the inorganic material is exposed to the atmosphere containing hydrogen and is reduced. In order to form a photoconductor layer of good quality, the substrate temperature is held at 200° C.–400° C. as stated before, so that the reduction is conspicuous. While a change in the material property affects particularly the photo current and dark current characteristics, the aforecited materials of $SiO_2$ etc. are substantially free from such problems.

The thickness of the inorganic material layer is made 50 Å–5,000 Å or so. Especially when it is made 1,000 Å or less, the transmission of incident light decreases little, and it is unnecessary to fear that the sensitivity of the photoelectric device will lower.

Usually, it is very favorable to form the foregoing oxide layer by means of the sputtering evaporation by employing the oxide identical to that of the layer as an evaporation source material.

The sputtering evaporation is ordinarily relied on a radio-frequency discharge in Ar gas under $1 \times 10^{-1}$ Torr to $1 \times 10^{-3}$ Torr. At this time, in case where the oxide is liable to be reduced to blacken, at most about 5 volume-% of oxygen may be mixed in the Ar gas.

While the substrate temperature during the evaporation may be 25° C.–400° C., a value of 100° C.–250° C. is favorable for forming a film which is closely adherent to the substrate and whose smoothness is good.

The thin layer of any of the foregoing oxides, nitrides and halides is interposed between the photoconductive film and the signal electrode. However, it need not always adjoin the signal electrode, but a layer made of another material may well intervene between the signal electrode and the thin layer described above. It is necessary, however, that the photoconductive film and the oxide adjoin each other.

EXAMPLE 1

Figure 2:
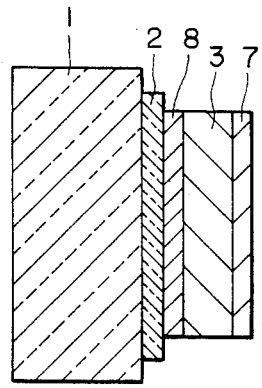
FIG. 2 is a sectional view showing the structure of a photoelectric device according to this invention.

As shown in FIG. 2, a transparent electrode 2 (serving as a signal electrode) made of $SnO_2$ was formed on a glass substrate 1. The resultant substrate was installed on a substrate holder electrode in a radio-frequency sputtering equipment. On the other hand, an $SiO_2$ target was installed on a target electrode. Subsequently, a sputtering chamber was evacuated to a pressure of below $5 \times 10^{-6}$ Torr, whereupon Ar gas was introduced thereinto so as to establish a gaseous pressure of $1.0 \times 10^{-2}$ Torr.

Under this gaseous pressure, a radio-frequency discharge at a frequency of 13.56 MHz and a power of 1 W/cm$^2$ was caused across both the electrodes, to form an $SiO_2$ thin film 8 on the transparent electrode 2 to a thickness of approximately 250 Å.

Subsequently, a sintered compact of silicon at a purity of 99.999% was installed on the target electrode of the radio-frequency sputtering equipment, and an amorphous silicon film 3 was formed on the $SiO_2$ thin film 8 by the reactive sputtering in a mixed atmosphere which consisted of Ar under $1 \times 10^{-3}$ Torr and hydrogen under $2 \times 10^{-3}$ Torr. In this case, the substrate was held at 250° C. The amorphous silicon film thus formed contained approximately 20 atomic-% of hydrogen, and had a resistivity of $10^{14}$ Ω·cm.

The $SiO_2$ thin film 8 can be formed by the electron-beam evaporation besides by the sputtering described above. An $SiO_2$ film formed by the electron-beam evaporation exhibits a dark current-suppressing effect to the same extent as that of the $SiO_2$ film formed by the sputtering. In general, however, the evaporated film is lower than the sputtered film in the adhesion with the substrate, so that the former sometimes exfoliates from the substrate when the amorphous silicon is deposited thereon.

Lastly, as a beam landing layer for improving the landing characteristic of an electron beam, an $Sb_2S_3$ film 7 was evaporated in an Ar gas pressure to a thickness of approximately 1,000 Å.

The beam landing layer is conventional in image tubes.

An image tube target prepared by the method described above had dark currents suppressed to sufficiently low magnitudes even at high target voltages.

Figure 3:
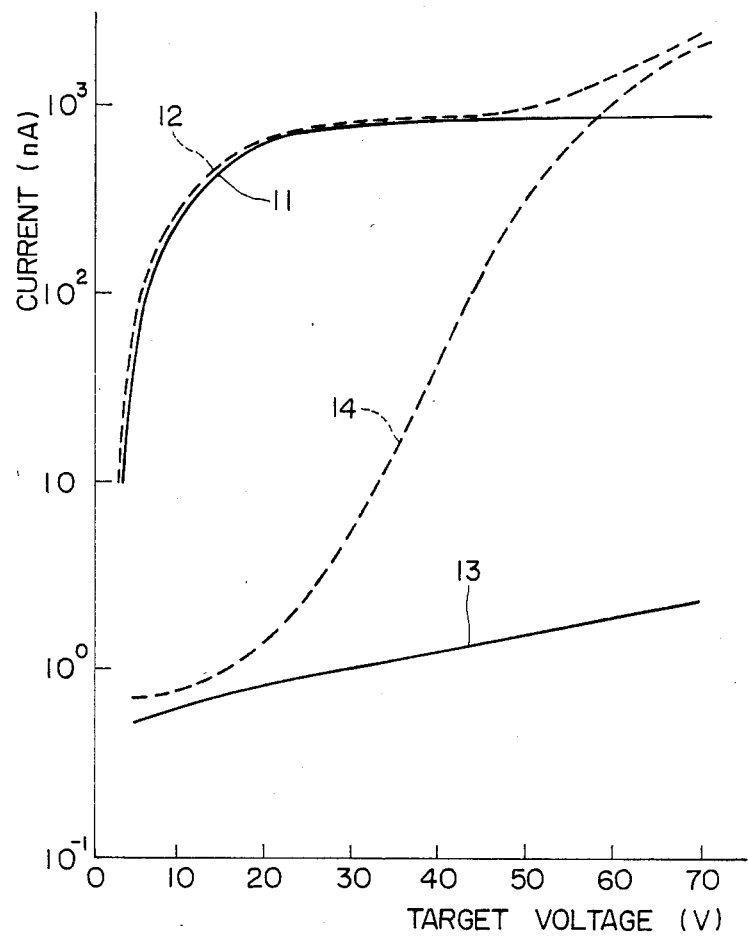
FIG. 3 is a graph showing the relationships of the photo current and the dark current to the target voltage in the photoelectric device of this invention, in comparison with a case where this invention is not applied.

FIG. 3 is a graph showing measured results on photo currents and dark current components in the photo currents versus target voltages. Numerals 11 and 13 indicate the photo currents and the dark current components in the photo currents in an image tube which adopted this invention, respectively, while numerals 12 and 14 indicate the photo currents and the dark current components in an image tube which did not employ the $SiO_2$ film according to this invention, respectively. It is understood from this figure that the present invention is very greatly effective to suppress the dark current.

EXAMPLE 2

A transparent electrode made of $In_2O_3$ was formed on a glass substrate, and any of various thin films listed in the following table 2 was formed thereon by the sputtering evaporation in accordance with the same method as in Example 1. Further, a silicon layer containing 15 atomic-% of hydrogen was formed by the reactive sputtering to a thickness of 2 μm.

In forming the hydrogen-containing amorphous silicon film corresponding to each of the samples other than the $Al_2O_3$ film, the temperature of the substrate was set as follows. The substrate temperature was held at the normal temperature at the initiation of the formation of the silicon film, and it was raised to a predetermined value with the deposition of the film. This measure was taken in order to prevent the reduction by hydrogen in the atmosphere as stated before. The silicon film formed served as a protective film. The characteristics of the photoconductor are somewhat inferior, but can be put into practical use.

Lastly, an $Sb_2S_3$ film was evaporated in an Ar gas pressure, to finish up a target for an image tube. As indicated in Table 2, favorable characteristics similar to those in Example 1 were exhibited.

TABLE 2

|  | Ar gas pressure (Torr) | Radio-frequency power (W/cm$^2$) | Thickness (Å) | Dark current (nA) |
|---|---|---|---|---|
| $TiO_2$ | $4 \times 10^{-2}$ | 1 | 500 | 1.2 |
| BaO | $5 \times 10^{-3}$ | 1.5 | 250 | 1.2 |
| $Ta_2O_3$ | $5 \times 10^{-3}$ | 2 | 200 | 1.4 |
| $Al_2O_3$ | $3 \times 10^{-2}$ | 1.5 | 200 | 1.5 |
| MgO | $2.5 \times 10^{-3}$ | 0.5 | 300 | 4.0 |
| $V_2O_5$ | $5 \times 10^{-3}$ | 2 | 300 | 2.5 |
| $La_2O_3$ | $2 \times 10^{-3}$ | 1 | 300 | 9.5 |

$V_T = 50$ V

Even with a multilayered film in which $SiO_2$ and at least one material selected from the group consisting of the above-mentioned materials are stacked with each thin layer being several tens Å thick (for example, $SiO_2$ and $Al_2O_3$ are stacked), similar effects are achieved.

EXAMPLE 3

A transparent electrode made of $SnO_2$ was formed on a glass substrate, and was overlaid with any of various thin films listed in Table 3 by the sputtering, the decomposition by the glow discharge, the vacuum evaporation, or the electron-beam evaporation. Further, an amorphous silicon layer containing 15 atomic-% of hydrogen was formed by the reactive sputtering to a thickness of 2 μm. Lastly, an $Sb_2S_3$ film was evaporated in an Ar gas pressure, to finish up a target for an image tube. As indicated in Table 3, favorable characteristics similar to those in Example 1 were exhibited.

TABLE 3

|  |  | $V_T = 50$ V | |
|---|---|---|---|
|  | Method of forming a blocking layer | Thickness (Å) | Dark current (nA) |
| $Si_3N_4$ | Decomposition by the glow discharge | 500 | 1.2 |
| TaN | Reactive sputtering | 150 | 1.8 |
| LiF | Vacuum evaporation | 150 | 1.0 |
| $MgF_2$ | Electron-beam evaporation | 200 | 1.5 |
| GaN | Reactive sputtering | 250 | 3.5 |
| $MgN_2$ | Reactive sputtering | 300 | 4.5 |
| $CaF_2$ | Electron-beam evaporation | 200 | 4.0 |
| BaF | Electron-beam evaporation | 250 | 5.0 |
| ZrN | Reactive sputtering | 300 | 14.0 |
| NaF | Vacuum evaporation | 200 | 13.0 |

What is claimed is:

1. In a photoelectric device having at least a signal electrode, and an amorphous photoconductor layer whose principal constituent is silicon and which contains at least 5 atomic-% to at most 50 atomic-% of hydrogen as an indispensable constituent element, the amorphous photoconductor layer being disposed close to the signal electrode; the photoelectric device being characterized in that a thin layer is interposed between said signal electrode and said amorphous photoconductor layer, said thin layer being made of an inorganic material consisting essentially of at least one compound selected from the group consisting of an oxide of at least one element selected from the group consisting of Si, Ba, Ta, Ti and Al, a nitride of an element selected from the group consisting of Si and Ta, and a halide of an element selected from the group consisting of Li and Mg.

2. A photoelectric device according to claim 1, wherein said inorganic material of said thin layer consists essentially of at least one compound selected from the group consisting of $SiO_2$, $BaO$, $Ta_2O_5$, $TiO_2$, $Al_2O_3$, $Si_3N_4$, $TaN$, $LiF$, and $MgF_2$.

3. A photoelectric device according to claim 1, wherein said inorganic material of said thin layer consists essentially of at least one compound selected from the group consisting of $SiO_2$, $Al_2O_3$, $BaO$, $Ta_2O_5$, $Si_3N_4$, $TaN$, $LiF$ and $MgF_2$.

4. A photoelectric device according to claim 1, wherein said thin layer made of said inorganic material has a thickness of 50 Å to 5,000 Å.

5. A photoelectric device according to claim 1, further comprising a light-transmitting substrate, on which said signal electrode is disposed, the surface of said substrate, which is opposite to said signal electrode, constituting a light receiving surface.

6. A photoelectric device according to claim 1, wherein said amorphous photoconductor layer consists essentially of at least 50 atomic-% of silicon and at least 5 atomic-% to at most 50 atomic-% of hydrogen with at least 0.1 atomic-% to at most 50 atomic-% of the silicon being substituted by germanium.

7. A photoelectric device comprising a transparent signal electrode, an amorphous photoconductor layer consisting essentially of at least 50 atomic-% of silicon and at least 5 atomic-% to at most 50 atomic-% of hydrogen with up to at most 50 atomic-% of the silicon in said layer being substituted by germanium and a thin layer interposed between and in contact with said signal electrode and said amorphous photoconductive layer; said thin layer having a thickness of 50 Å to 5,000 Å and being made of an inorganic material consisting of at least one compound selected from the group consisting of an oxide of at least one element selected from the group consisting of Si, Ba, Ta, Ti and Al, a nitride of an element selected from the group consisting of Si and Ta, and a halide of an element selected from the group consisting of Li and Mg.

8. A photoelectric device according to claim 7, wherein said inorganic material of said thin film consists of at least one compound selected from the group consisting of $SiO_2$, $BaO$, $Ta_2O_5$, $TiO_2$, $Al_2O_3$, $Si_3N_4$, $TaN$, $LiF$ and $MgF_2$.

* * * * *